(12) United States Patent
Ha et al.

(10) Patent No.: US 6,548,196 B2
(45) Date of Patent: Apr. 15, 2003

(54) WALLPAPER FOR SHIELDING ELECTROMAGNETIC WAVES

(75) Inventors: Jae-Mok Ha, Seoul (KR); Jin-U Park, Goyang (KR); Jin-Ouk Jang, Yongin (KR); Hyun-Sik Hahm, Seoul (KR)

(73) Assignee: AD-Tech Co., Ltd., Gunpo (KR)

( * ) Notice: Subject to any disclaimer, the term of this patent is extended or adjusted under 35 U.S.C. 154(b) by 0 days.

(21) Appl. No.: 09/819,954

(22) Filed: Mar. 29, 2001

(65) Prior Publication Data

US 2001/0028946 A1 Oct. 11, 2001

(30) Foreign Application Priority Data

Mar. 30, 2000 (KR) .................................... 2000-0016717

(51) Int. Cl.⁷ .............................................. H01L 39/00
(52) U.S. Cl. ...................... 428/930; 428/689; 428/607; 428/332; 428/611; 428/615; 428/620; 428/359
(58) Field of Search ................................. 428/364, 373, 428/392, 394, 395, 688, 689, 924, 930, 931, 607, 332, 611, 615, 620

(56) References Cited

U.S. PATENT DOCUMENTS

| | | | |
|---|---|---|---|
| 4,647,714 A | * | 3/1987 | Goto .......................... 174/36 |
| 4,774,148 A | * | 9/1988 | Goto .......................... 428/607 |
| 5,244,708 A | * | 9/1993 | Tsuchida et al. .............. 428/77 |
| 6,355,707 B1 | | 3/2002 | Jang et al. ................... 523/137 |

* cited by examiner

Primary Examiner—Merrick Dixon
(74) Attorney, Agent, or Firm—Jacobson Holman PLLC

(57) ABSTRACT

Wallpaper for shielding electromagnetic waves, which can effectively shield wideband frequency electromagnetic waves and prevent static electricity, is provided. The wallpaper is prepared by applying and coating onto at least one surface of raw paper a coating composition comprising, mixed in a predetermined ratio based on the total weight of the composition, 1 to 69% by weight of at least one material selected from the group consisting of a conductive polymer material with about 1% to about 100% solids by weight of the conductive polymer material, conductive carbon and graphite, 30 to 98% by weight of matrix polymer with about 1% to about 50% solids by weight of the matrix polymer, 0 to 59% by weight of a solvent and 1 to 40% by weight of additives. Also, in order to form a protection layer for protecting the electromagnetic wave shielding layer and to enhance commodity attraction, a patterned layer is further formed and the resulting structure is dried. Using the resulting wallpaper, harmful wideband electromagnetic waves emitted from various kinds of electronic devices can be effectively shielded. Also, the malfunction of various home appliances, caused by electromagnetic interference, can be prevented by decorating the interior walls of the home using the electromagnetic wave shielding wallpaper.

17 Claims, 2 Drawing Sheets

WALLPAPER FOR SHIELDING ELECTROMAGNETIC WAVES

BACKGROUND OF THE INVENTION

1. Field of the Invention

The present invention relates to wallpaper for shielding electromagnetic waves and, more particularly, to wallpaper for shielding electromagnetic waves prepared by applying and coating onto the surface of raw paper, a coating composition which is composed of at least one material selected from the group consisting of a conductive polymer material having inherent resistance against electromagnetic waves, conductive carbon and graphite, and additives, mixed in a predetermined mixing ratio.

2. Description of the Related Art

As social concerns have recently grown increasingly about human health, research into the effects of various kinds of harmful waves on the human body and the methods of effectively shielding such harmful waves has been vigorously carried out. According to scientific research carried out hitherto, electromagnetic waves have been proven to be the most typical harmful waves.

A large amount of electromagnetic wave interference is emitted from electric wires and electric/electronic product, that have been in general use, such as home appliances, wireless communication devices, control devices, power systems, high-frequency equipment, lighting devices, electric heaters, microwave ovens and so on. Thus, it is no exaggeration to say that the electromagnetic waves are being emitted from all parts of the world. In recent years, the electromagnetic wave noise emitted from various digital systems including computers has been recognized as the most serious artificial noise source.

The general theory and adverse effect of electromagnetic waves will now be briefly described. Electromagnetic waves refer to waves generated while an electric field, formed by the intensity of charges, and a magnetic field, formed by the movement of charges, travel in phase with time. While the electric field is absorbed or shielded by conductive materials, the magnetic field has high transmissivity, that is, the magnetic field penetrates all kinds of materials. In particular, it is known that the magnetic field is much more hazardous to the human body than the electric field.

It is also known that the electromagnetic fields cause to a greater or lesser degree, various functional disorders in living tissue. Research efforts on the protection of the human body against the adverse effect of electromagnetic waves are actively underway.

A conventional means for shielding electromagnetic waves, that is, electromagnetic wave shielding wallpaper, will now be described by way of example.

FIG. 1 is a perspective view showing conventional wallpaper 10 for shielding electromagnetic waves.

As shown in FIG. 1, the conventional wallpaper 10 for shielding electromagnetic waves is prepared by adhering metal coated paper 16 to the back surface of raw paper 12 having a front and gravure printed surface, by means of an adhesive 14. Here, nickel (Ni) or copper (Cu) coated fabrics or nonwoven fabrics, that have been pre-treated, catalyzed and activated, can be used as the metal coated paper 16.

Alternatively, the conventional electromagnetic wave shielding wallpaper may be prepared by coating a solution of electromagnetic wave absorbent material on the entire surface of the front surface of raw paper and drying the resultant surface, foaming and applying a polyvinyl chloride (PVC) compound onto the entire surface of the electromagnetic wave absorbent layer to a predetermined thickness, coating an appropriate surfactant, which may vary according to use, and then performing conventional post-treatment. Here, the electromagnetic wave absorbent material comprises at least one of iron oxide ($Fe_2O_3$), nickel oxide (NiO), zinc oxide (ZnO) and copper oxide (CuO) as the main component, a dispersing agent and a lubricator. The PVC compound comprises PVC, dioctylphosphate, a stabilizer, a foaming agent, $TiO_2$, and a filler, e.g., $CaCO_3$.

However, since the conventional electromagnetic wave shielding wallpaper is quite difficult to manufacture, improvement in the productivity thereof cannot be expected. Also, since metal is employed as an electromagnetic wave shielding material, the manufacturing cost is considerably high.

SUMMARY OF THE INVENTION

To solve the above problems, it is an object of the present invention to provide wallpaper for shielding electromagnetic waves, which can effectively shield external electromagnetic waves, and which can exhibit the effect of preventing static electricity, by coating a coating composition which is composed of at least one material selected from the group consisting of a conductive polymer material having inherent resistance against electromagnetic waves, conductive carbon and graphite, and additives, mixed in a predetermined mixing ratio.

It is a second object of the present invention to protect the human body against the damages due to electromagnetic wave hazard by effectively shielding external electromagnetic waves using the electromagnetic wave shielding wallpaper.

It is a third object of the present invention to simplify the manufacturing process of electromagnetic wave shielding wallpaper to ease preparation of the wallpaper, and to reduce the manufacturing cost thereof.

In addition to the foregoing objectives, the present invention is directed to prevent malfunctioning of electronic appliances, due to electromagnetic wave interference, by decorating the interior wall of homes using the electromagnetic wave shielding wallpaper.

To achieve the above objects, there is provided wallpaper for shielding electromagnetic waves, the wallpaper prepared by applying and coating onto at least one surface of raw paper a coating composition comprising, mixed in a predetermined ratio based on the total weight of the composition, 1 to 69% by weight of at least one material selected from the group consisting of a conductive polymer material with about 1% to about 100% solids by weight of the conductive polymer material, conductive carbon and graphite, 30 to 98% by weight of matrix polymer with about 1% to about 50% solids by weight of the matrix polymer, 0 to 59% by weight of a solvent and 1 to 40% by weight of additives, and then drying the resultant surface.

Here, the conductive polymer materials include polyaniline, polypyrrole, polythiophene and derivative materials thereof, alone or in combination of two or more kinds of such materials.

Preferably, the matrix polymer is at least one material selected from the group consisting of acrylic copolymer, acrylic emulsion resin, vinyl emulsion resin, acryl resin, alkyd resin and polyester resin.

Also, the raw paper may be at least one kind of paper selected from the group consisting of raw paper for underlining, raw paper for wallpapering, nonwoven fabrics, and combination paper of nonwoven fabrics and raw paper.

The nonwoven fabrics are preferably synthetic fibers based on rayon, polyester, polypropylene, polyvinyl chloride and polyethylene terephthalate.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENTS

Figure 1:
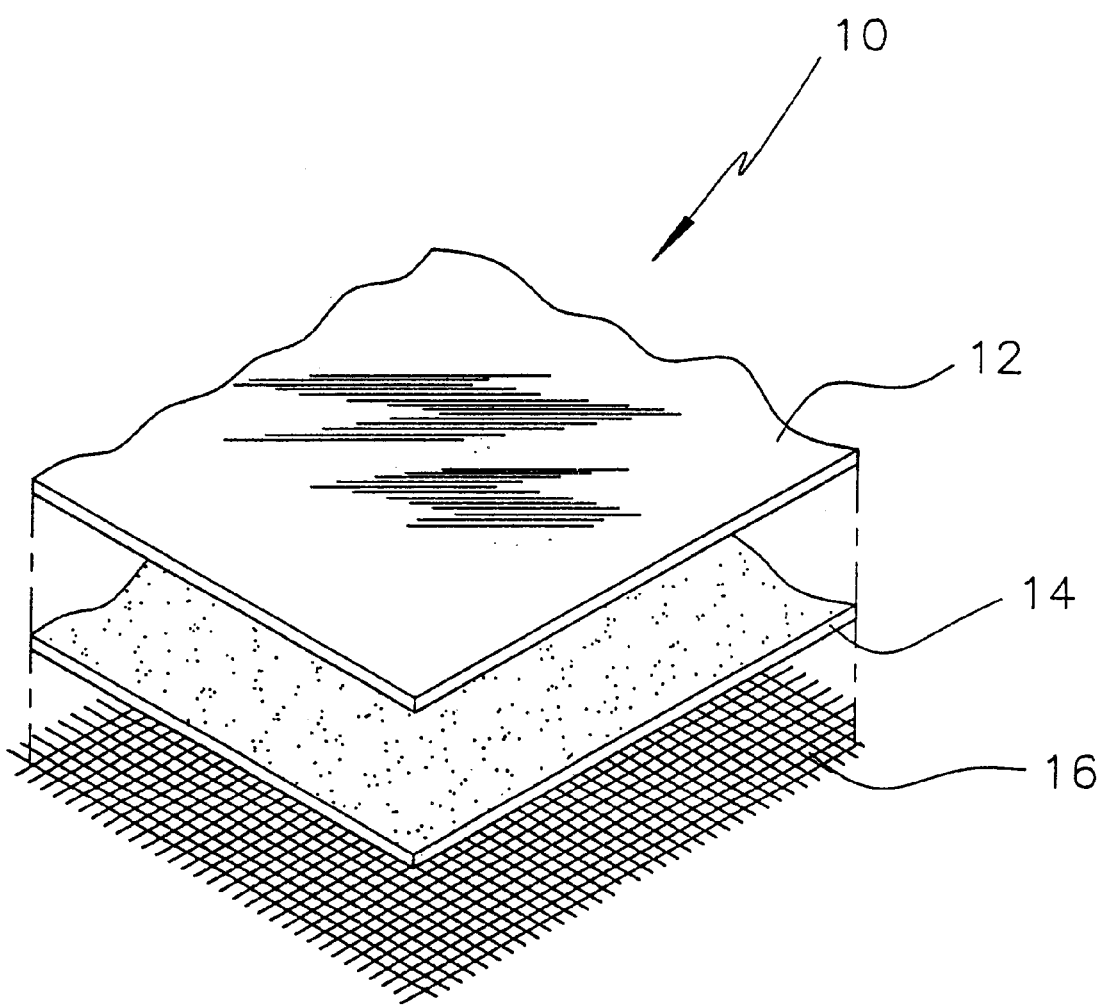
FIG. 1 is a perspective view of conventional wallpaper for shielding electromagnetic waves.

Prior to explanation of wallpaper for shielding electromagnetic waves according to the present invention, the recent critical issue about the hazards of electromagnetic waves will be briefly discussed. In other words, the current controversy regarding the harm of electromagnetic waves is related to the possibilities that weak electromagnetic waves of low frequency are harmful to the human body when the body is exposed thereto for a long period of time. Strong electromagnetic waves have been proven scientifically to be harmful to the human body. In order to protect the human body from the harm of electromagnetic waves, the acceptable maximum exposure is stipulated in many countries. Unfortunately, however, no regulations in this regard have ever been stipulated in Korea.

It is known that when the human body is exposed to low-frequency electromagnetic waves for a long period of time, inductive current is generated at the interior of the human body which causes unbalance in various intracellular or extracellular ions such as $Na^+$, $K^+$, $Cl^-$ and so on, thereby affecting the hormone excretion and immune cells.

As described above, electromagnetic waves are composed of electric fields and magnetic fields, the former being generated in proportion to the intensity of voltage and the latter being generated in proportion to the magnitude of current. While electric fields are considerably shielded by highly conductive materials, magnetic fields are shielded only by special alloys having very strong magnetism. Thus, it is not that easy to shield the magnetic fields. It is also known that when the human body is exposed to electric fields, skin diseases such as eczema may be induced in the human body which is composed of conductive materials. Further, it is known that magnetic fields that can penetrate the human body affect iron molecules present in the blood. Electromagnetic waves are more harmful to children or tissues such as lymph, genitals or blood corpuscles in which cells proliferate quickly.

Symptoms which may be caused by exposure to electromagnetic waves include languor, insomnia, nervousness, headache, reduced excretion of hormones such as melatonin which is related to sound sleep, reduced pulse rate, and so on. Diseases which may be caused by exposure to electromagnetic waves include leukemia, lymph cancer, brain cancer, central nervous system cancer, breast cancer, imbecility, miscarriage, birth defects, and so on.

In an attempt to prevent exposure to harmful electromagnetic waves, which may cause various diseases, a number of electromagnetic wave shield products are being developed. In particular, in order to protect the human body from the harmful electromagnetic waves emitted from various electronic devices, wallpaper for shielding electromagnetic waves has been invented.

The wallpaper for shielding electromagnetic waves according to the present invention will now be described in detail.

Wallpaper is generally used in hot-floored (termed "ondol" in Korean) houses to decorate the walls of the room. As is well known, the wallpaper is prepared by gravure printing the surface of raw paper and then printing a coating composition thereon.

Figure 2:
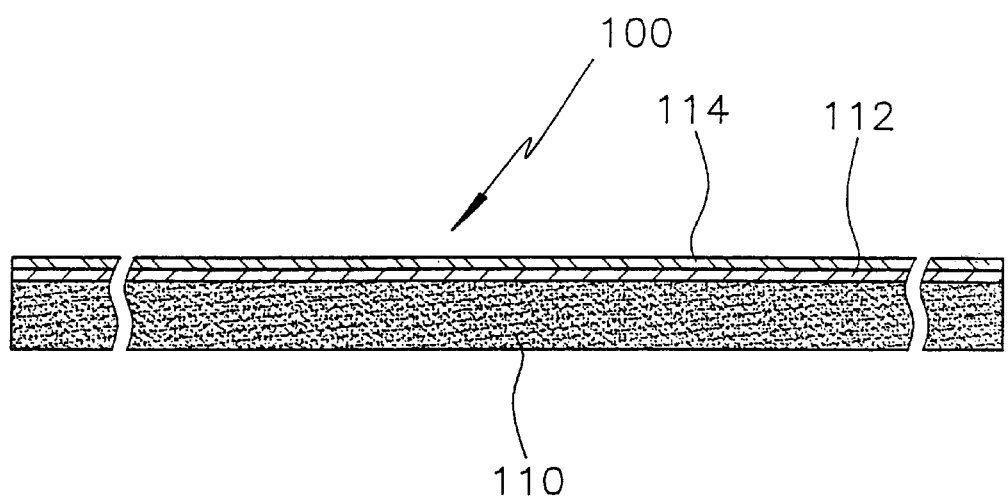
FIG. 2 is a longitudinal cross-sectional view of wallpaper for shielding electromagnetic waves according to an embodiment of the present invention.
Figure 3:
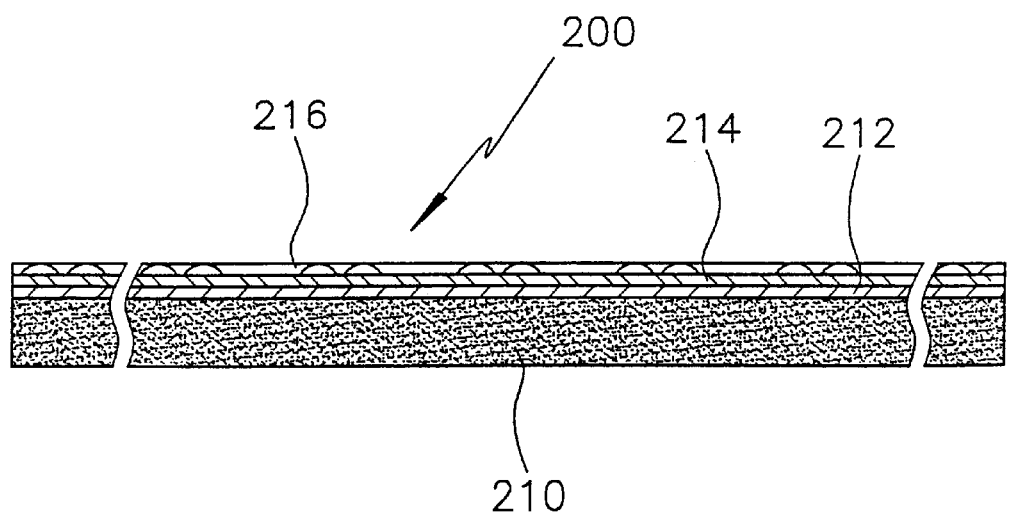
FIG. 3 is a longitudinal cross-sectional view of wallpaper for shielding electromagnetic waves according to another embodiment of the present invention.

FIG. 2 is a longitudinal cross-sectional view of wallpaper for shielding electromagnetic waves according to an embodiment of the present invention, and FIG. 3 is a longitudinal cross-sectional view of wallpaper for shielding electromagnetic waves according to another embodiment of the present invention.

As shown in FIG. 2, the electromagnetic wave shielding wallpaper 100 according to the present invention is prepared by applying and coating onto at least one surface of raw paper 110 a coating composition comprising, mixed in a predetermined ratio based on the total weight of the composition, 1 to 69% by weight of at least one material selected from the group consisting of a conductive polymer material with about 1% to about 100% solids by weight of the conductive polymer material, conductive carbon and graphite, 30 to 98% by weight of matrix polymer with about 1% to about 50% solids by weight of the matrix polymer, 0 to 59% by weight of a solvent and 1 to 40% by weight of additives including a catalyst, a wetting agent, a coalescing agent, a defoamer, a thickener and the like. Then, the resulting mixture is dried, thereby obtaining the desired coating composition.

The above-described coating composition is prepared by stirring the mixture of the above noted ingredients in an appropriate mixing ratio, that is, at least one material selected from the group consisting of a conductive polymer material, conductive carbon and graphite, matrix polymer, a solvent and additives including a catalyst, a wetting agent, a coalescing agent, a defoamer, and a thickener, at 1000 to 2000 RPM for approximately one hour. The thus-prepared coating composition is applied and coated onto one or more surfaces of the raw paper 110. One or more surfaces of the raw paper 110 are coated with coating composition using techniques including blade or knife coating, air or knife coating, roll coating, and dip coating, to form an electromagnetic wave shielding layer 112.

By forming the electromagnetic wave shielding layer 112 on one or more surfaces of the raw paper 110 using a technique such as the blade or knife coating, air or knife coating, roll coating or dip coating, the electromagnetic wave shielding layer 112 can exert not only its main effect of effectively shielding electromagnetic waves but also its side effects of antibiosis, deodorization, radiation of far infrared rays, generation of negative ions, and so on.

In the case where the prepared coating composition is a water-based composition, the content of the solid matter contained in the conductive polymer material is preferably in the range of about 7% to 25% by weight. In the case where the prepared coating composition is an oil-based composition, the content of the solid matter contained in the conductive polymer material is preferably in the range of about 95% to 100% by weight.

In order to protect the electromagnetic wave shielding layer 112, a protection layer 114 for the electromagnetic wave shielding layer 112 is preferably formed of acrylic copolymer or acrylic emulsion resin.

As used herein, the term "conductive polymer material" refers to a polymer material having electric conductivity, also called an organic metal, including polyaniline, polypyrrole, polythiophene and derivative materials thereof. In the present invention, the conductive polymer material such as polyaniline, polyrrole, polythiophene and derivative materials thereof can be used alone or in a combination of two or more kinds of such materials.

In the electromagnetic wave shielding wallpaper 100 according to the present invention, useful water-based matrix polymers include an acrylic copolymer such as an ethyl acrylate copolymer or methacrylic acid copolymer, acrylic emulsion resin and vinyl emulsion resin. Useful oil-based matrix polymers include styrene-modified acryl resin and polyester resin. Here, both water-based and oil-based matrix polymers can be used as the matrix polymer, the water-based matrix polymer being preferable from an environmental standpoint.

The coating composition can be prepared by mixing conductive carbon and graphite as a single component or mixture thereof, resulting, however, in undesirable smearing during formation of the electromagnetic wave shielding layer 112 by applying and coating the coating composition onto one or more surfaces of the raw paper 110. Thus, the conductive carbon or graphite in a single component or mixture thereof is preferably used as the additive of the conductive polymer material. Here, the content of the additive of the conductive polymer is preferably 3 to 5% by weight.

The additives used for the coating composition include, for example, a catalyst, a wetting agent, a coalescing agent, a defoamer and a thickener. In particular, usable catalysts include organotin compounds, dibutyltinoxides, dibutyltindisulfides, stannous actoates and tetraisobutyltitanates, alone or in a combination of two or more such materials.

Usable wetting agents include 4 to 10 moles of polyoxyethylene nonylphenyl ether (ethylene oxide), 5 to 10 moles of polyoxyehtylene octylphenyl ether (ethylene oxide), ditridecyl sodium sulfosuccinate and polyethyleneglycol laurate having hydrophilic-lipophilic balance (HLB) ratio of 6 to 15, alone or in a combination of two or more such materials.

Usable coalescing agents include 2,2,4-trimethyl-1,3-penanediol monoisobutyrate, butyl carbitol acetate, butyl cellosolve, butyl cellosolve acetate and diethyleneglycol butyl ether acetate, alone or in a combination of two or more such materials.

Usable defoamers include selected PEG-2 tallowate, isooctylalcohol and disodium tallow sulfosuccinamate, alone or in a combination of two or more such materials.

Usable thickeners include a modified hydroethylcellulose polymer, polyethylenecellulose, an acrylic acid ester copolymer, ammonium polyacrylate, alone or in a combination of two or more such materials.

In the aforementioned electromagnetic wave shielding wallpaper 100, the raw paper 110 may include raw paper for underlining, raw paper for wallpapering, nonwoven fabrics, combination paper of nonwoven fabrics and raw paper. The nonwoven fabrics usable in the raw paper 110 include any synthetic fibers based on rayon, polyester, polypropylene, polyvinyl chloride and polyethylene terephthalate.

Alternatively, the electromagnetic wave shielding wallpaper according to the present invention can also be prepared in the manner shown in FIG. 3. In other words, an electromagnetic wave shielding wallpaper 200 according to another embodiment of the present invention, is prepared by applying and coating a coating composition onto one or more surfaces of raw paper 210 to form an electromagnetic wave shielding layer 212, blanket-depositing a PVC compound over the electromagnetic wave shielding layer 212 to a constant thickness and defoaming the resulting structure to form a PVC-component protection layer 214 for electromagnetic wave shielding layer, and then forming PVC defoamed wallpaper with a patterned layer 216 designed thereon, for shielding electromagnetic waves.

As described above, the components for the matrix polymer and coating composition may also be made of any other material including the above-referenced materials. However, the feature of the present invention lies in that a conductive polymer material, conductive carbon and graphite are mixed and used alone or in combination of such materials to provide electromagnetic wave shielding wallpaper 100, 200 configured to effectively shield electromagnetic waves, even if the components forming the matrix polymer used in coating and the water- or oil-based coating composition are different.

The following examples are set forth to illustrate this invention in detail and are not intended to limit the scope of this invention thereto. Modifications and variations can be effected within the spirit and scope of the invention.

EXAMPLE 1

42% by weight of acrylic copolymer with about 34% solids by weight thereof, 48% by weight of polyaniline with about 17% solids by weight thereof, 7% by weight of distilled water and 3% by weight of additives including a coalescing agent, a catalyst, a thickener, a defoamer and a wetting agent, were mixed by stirring at 1500 RPM for one hour, to prepare a water-based coating composition, which was then coated onto one surface of raw paper (for either underlining or wallpaper) and dried by dry laminating so as to obtain a dried coating layer having a thickness of about 70 μm. After drying the coating layer for shielding electromagnetic waves, the resulting layer was coated with acrylic copolymer with about 45% solids by weight, thereby completing the electromagnetic wave shielding wallpaper.

EXAMPLE 2

Another electromagnetic wave shielding wallpaper was prepared in the same manner as in Example 1, except that the dried coating layer was coated to a thickness of 30 μm.

EXAMPLE 3

Another electromagnetic wave shielding wallpaper was prepared in the same manner as in Example 2, except that nonwoven fabrics (PET synthetic fibers) were used for raw paper.

EXAMPLE 4

Another electromagnetic wave shielding wallpaper was prepared in the same manner as in Example 2, except that combination paper consisting of PET synthetic fibers and Korean traditional paper such as (sliding) screen paper, to be termed "screen paper" hereinafter, was used for raw paper.

EXAMPLE 5

A PVC compound was coated on the electromagnetic wave shielding layer of the electromagnetic wave shielding wallpaper prepared in Example 2 to a predetermined thickness, foamed by applying heat thereto and then cooled, to form a protection layer for the electromagnetic wave shielding layer. Then, a patterned layer with various types of decorative patterns was formed on the protection layer, thereby completing PVC foamed wallpaper for shielding electromagnetic waves, as shown in FIG. 3.

EXAMPLE 6

Another electromagnetic wave shielding wallpaper was prepared in the same manner as in Example 2, except that the content of polyaniline with 17% solids by weight thereof was reduced from 48% by weight to 28% by weight, and that 20% by weight of conductive carbon with 17% solids by weight thereof was added.

EXAMPLE 7

Another electromagnetic wave shielding wallpaper was prepared in the same manner as in Example 2, except that the content of polyaniline with 17% solids by weight thereof was reduced from 48% by weight to 28% by weight, and that 20% by weight of graphite with 17% solids by weight thereof was added.

EXAMPLE 8

Another electromagnetic wave shielding wallpaper was prepared in the same manner as in Example 2, except that the content of acrylic copolymer with 34% solids by weight thereof was increased from 42% by weight to 62% by weight, and that 10% by weight of conductive carbon with 17% solids by weight thereof and 10% by weight of graphite with 17% solids by weight thereof, were used instead of polyaniline.

EXAMPLE 9

85% by weight of acrylic resin with about 30% solids by weight of the acrylic resin, 10% by weight of polyaniline with about 95% solids by weight thereof, and 5% by weight of additives including a coalescing agent, a defoamer, a surfactant and a catalyst, were mixed by stirring at 1500 RPM for 30 minutes, to prepare an oil-based coating composition, which was then coated onto one surface of raw paper by gravure printing so as to obtain a dried coating layer having a thickness of about 70 μm, thereby completing the electromagnetic wave shielding wallpaper.

EXAMPLE 10

Another electromagnetic wave shielding wallpaper was prepared in the same manner as in Example 9, except that the dried coating layer was coated to a thickness of 30 μm.

EXAMPLE 11

Another electromagnetic wave shielding wallpaper was prepared in the same manner as in Example 10, except that nonwoven fabrics (PET synthetic fibers) were used for raw paper.

EXAMPLE 12

Another electromagnetic wave shielding wallpaper was prepared in the same manner as in Example 10, except that combination paper consisting of PET synthetic fibers and screen paper, was used for raw paper.

EXAMPLE 13

A PVC compound was coated on the electromagnetic wave shielding layer of the electromagnetic wave shielding wallpaper prepared in Example 10 to a predetermined thickness, foamed by applying heat thereto and then cooled, to form a protection layer for the electromagnetic wave shielding layer. Then, a patterned layer with various types of decorative patterns was formed on the protection layer, thereby completing PVC foamed wallpaper for shielding electromagnetic waves, as shown in FIG. 3.

EXAMPLE 14

Another electromagnetic wave shielding wallpaper was prepared in the same manner as in Example 10, except that the content of polyaniline with 95% solids by weight thereof was reduced from 10% by weight to 7% by weight, and that 3% by weight of conductive carbon with 17% solids by weight thereof was added.

EXAMPLE 15

Another electromagnetic wave shielding wallpaper was prepared in the same manner as in Example 10, except that the content of polyaniline with 95% solids by weight thereof was reduced from 10% by weight to 7% by weight, and that 3% by weight of graphite with 17% solids by weight thereof was added.

EXAMPLE 16

Another electromagnetic wave shielding wallpaper was prepared in the same manner as in Example 10, except that 5% by weight of conductive carbon with 17% solids by weight thereof and 5% by weight of graphite with 17% solids by weight thereof, were used instead of polyaniline.

EXAMPLE 17

Another electromagnetic wave shielding wallpaper was prepared in the same manner as in Example 9, except that 10% by weight of polypyrrole was used instead of polyaniline.

To investigate characteristics of the electromagnetic wave shielding wallpapers prepared in Examples 1–17, the shielding effectiveness was tested by an ASTM D4935-89 coaxial transmission line test method, the deodorization efficiency was tested by a KICM-FIR-1004 test method, the antibiosis was tested by a Shake Flask (FC-TM-19) test method, the antibacterial efficiency was tested by an ASTM G-21 test method, and the far infrared ray radiation rate was tested by black body measurement using an FT-IR spectrometer, respectively. The test results are summarized in Table 1.

TABLE 1

|  | Thickness (μm) ±5 | Shielding effectiveness (dB) ±5 | Deodorization efficiency (in 120 min. %) | Antibiosis (%) | Resistance to fungi (rating) | Far infrared ray radiation (5~20 μm) |
|---|---|---|---|---|---|---|
| Example 1 | 70 | 13 | 55 | 97 | 0 | 0.9 |
| Example 2 | 30 | 5 | 50 | 97 | 0 | 0.8 |
| Example 3 | 30 | 2 | 60 | 97 | 0 | 0.7 |
| Example 4 | 20 | 2.5 | 62 | 95 | 1 | 0.8 |
| Example 5 | 30 | 4.5 | 25 | 75 | 1 | 0.6 |
| Example 6 | 30 | 6 | 65 | 95 | 1 | 0.8 |
| Example 7 | 30 | 5.5 | 50 | 90 | 1 | 0.8 |
| Example 8 | 30 | 2.5 | 45 | 85 | 1 | 0.7 |
| Example 9 | 70 | 11 | 50 | 95 | 0 | 0.8 |
| Example 10 | 30 | 4 | 40 | 95 | 0 | 0.8 |
| Example 11 | 30 | 3 | 55 | 90 | 0 | 0.7 |
| Example 12 | 30 | 3 | 55 | 95 | 1 | 0.8 |
| Example 13 | 30 | 3.5 | 20 | 65 | 1 | 0.5 |
| Example 14 | 30 | 4.5 | 60 | 90 | 1 | 0.7 |
| Example 15 | 30 | 5 | 45 | 85 | 1 | 0.8 |
| Example 16 | 30 | 2.5 | 40 | 80 | 1 | 0.6 |
| Example 17 | 70 | 9 | 50 | 93 | 0 | 0.8 |

(Remarks: The raw papers used throughout the tests were all for underlining.)

As shown in Table 1, the electromagnetic wave shielding wallpapers 100 and 200 prepared in Examples 1–17 exhibited considerably good characteristics in view of shielding effectiveness, deodorization efficiency, antibiosis, resistance to fungi and far infrared ray radiation rate.

Therefore, the effect of protecting the human body from harmful electromagnetic waves can be expected by using the thus-prepared wallpapers 100 and 200 according to the present invention.

The present invention is not limited to the above-described embodiments, and modifications and variations can be made within the spirit and scope of the invention.

As described above, according to the present invention, the electromagnetic wave shielding wallpaper is prepared by applying and coating onto at least one surface of raw paper 110 a coating composition comprising, mixed in a predetermined ratio, 1 to 69% by weight of at least one material selected from the group consisting of a conductive polymer material with about 1% to about 100% solids by weight of the conductive polymer material, conductive carbon and graphite, 30 to 98% by weight of matrix polymer with about 1% to about 50% solids by weight of the matrix polymer, 0 to 59% by weight of a solvent and 1 to 40% by weight of additives, thereby shielding harmful wideband electromagnetic waves emitted from various kinds of electronic devices and exhibiting the effect of preventing static electricity.

Also, external electromagnetic waves can be effectively shielded by the electromagnetic wave shielding wallpaper according to the present invention, thereby protecting the human body from the hazard of electromagnetic wave pollution.

Further, according to the present invention, the preparation process of the electromagnetic wave shielding wallpaper can be simplified, thereby facilitating the preparation and reducing the manufacturing cost thereof.

Additionally, the malfunction of various home appliances, caused by electromagnetic interference, can be prevented by decorating the interior walls of the home using the electromagnetic wave shielding wallpaper according to the present invention.

What is claimed is:

1. Wallpaper for shielding electromagnetic waves, the wallpaper prepared by applying and coating onto at least one surface of raw paper, a coating composition comprising, mixed in a predetermined ratio based on the total weight of the composition, 1 to 69% by weight of at least one material selected from the group consisting of a conductive polymer material with about 1% to about 100% solids by weight of the conductive polymer material, conductive carbon and graphite, 30 to 98% by weight of matrix polymer with about 1% to about 50% solids by weight of the matrix polymer, 0 to 59% by weight of a solvent and 1 to 40% by weight of additives, and then drying.

2. The wallpaper according to claim 1, wherein the conductive polymer material comprises at least one member selected from the group consisting of polyaniline, polypyrrole, polythiophene and a derivative thereof.

3. The wallpaper according to claim 1, wherein the matrix polymer is at least one material selected from the group consisting of acrylic copolymer, acrylic emulsion resin, vinyl emulsion resin, acryl resin, alkyd resin and polyester resin.

4. The wallpaper according to claim 1, wherein the raw paper is at least one kind of paper selected from the group consisting of raw paper for underlining, raw paper for wallpapering, nonwoven fabric, and a combination paper of nonwoven fabric and raw paper.

5. The wallpaper according to claim 4, wherein the nonwoven fabric comprises synthetic fiber selected from the group consisting of rayon, polyester, polypropylene, polyvinyl chloride and polyethylene terephthalate.

6. The wallpaper according to claim 2, wherein the raw paper is at least one kind of paper selected from the group consisting of raw paper for underlining, raw paper for wallpapering, nonwoven fabric, and a combination paper of nonwoven fabric and raw paper.

7. The wallpaper according to claim 6, wherein the nonwoven fabric includes synthetic fiber based on a member selected from the group consisting of rayon, polyester, polypropylene, polyvinyl chloride and polyethylene terephthalate.

8. The wallpaper according to claim 3, wherein the raw paper is at least one kind of paper selected from the group consisting of raw paper for underlining, raw paper for wallpapering, nonwoven fabric, and combination paper of nonwoven fabric and raw paper.

9. The wallpaper according to claim 8, wherein the nonwoven fabric includes synthetic fiber selected from the group consisting of rayon, polyester, polypropylene, polyvinyl chloride and polyethylene terephthalate.

10. A composition consisting essentially of a substantially homogenous admixture of from 1 to 69% by weight of at least one material selected from the group consisting of a conductive polymer material with from 1 to 100% by weight of solids, conductive carbon and graphite; 30 to 98% be weight of matrix polymer with from 1 to 50% by weight of solids; from 1 to 40% by weight of additives and, optionally from 0 to 59% by weight of a solvent.

11. Wallpaper coated with a composition according to claim 10.

12. A dried composition wherein the composition prior to drying was that of claim 10.

13. Wallpaper coated with a layer of a dried composition according to claim 12, which provides an electromagnetic wave shielding layer.

14. Wallpaper according to claim 13 wherein the conductive polymer material comprises at least one member selected from the group consisting of polyaniline, polypyrrole, polythiophene and a derivative of any of the foregoing.

15. Wallpaper according to claim 13 wherein a protective layer covers the electromagnetic wave shielding layer.

16. Wallpaper according to claim 15 wherein the protective layer is covered by a further electromagnetic shielding layer.

17. A composition consisting essentially of a substantially homogenous admixture of from 1 to 69% by weight of conductive polymer material, from 30 to 98% by weight of matrix polymer, from 1 to 40% by weight of additives and, optionally, from 0 to 59% by weight of solvent;

the conductive polymer material comprising from 1 to 100% by weight of solids and, optionally, comprising a member selected from the group consisting of conductive carbon and graphite; and the matrix polymer comprising from 1 to 50% by weight of solids.

* * * * *